United States Patent
Shimizu et al.

(10) Patent No.: US 12,072,631 B2
(45) Date of Patent: Aug. 27, 2024

(54) RESIST UNDERLAYER FILM-FORMING COMPOSITION AND METHOD FOR FORMING RESIST PATTERN USING THE SAME

(71) Applicant: NISSAN CHEMICAL CORPORATION, Tokyo (JP)

(72) Inventors: Shou Shimizu, Toyama (JP); Ryuta Mizuochi, Toyama (JP); Hiroyuki Wakayama, Toyama (JP); Yasunobu Someya, Toyama (JP)

(73) Assignee: NISSAN CHEMICAL CORPORATION, Tokyo (JP)

( * ) Notice: Subject to any disclaimer, the term of this patent is extended or adjusted under 35 U.S.C. 154(b) by 748 days.

(21) Appl. No.: 17/281,362

(22) PCT Filed: Oct. 1, 2019

(86) PCT No.: PCT/JP2019/038741
§ 371 (c)(1),
(2) Date: Mar. 30, 2021

(87) PCT Pub. No.: WO2020/071361
PCT Pub. Date: Apr. 9, 2020

(65) Prior Publication Data
US 2021/0397090 A1    Dec. 23, 2021

(30) Foreign Application Priority Data
Oct. 5, 2018    (JP) .................... 2018-190024

(51) Int. Cl.
| | | |
|---|---|---|
| *G03F 7/004* | (2006.01) | |
| *C08G 59/22* | (2006.01) | |
| *C08G 59/26* | (2006.01) | |
| *G03F 7/11* | (2006.01) | |
| *H01L 21/027* | (2006.01) | |

(52) U.S. Cl.
CPC .............. *G03F 7/11* (2013.01); *C08G 59/223* (2013.01); *C08G 59/26* (2013.01); *H01L 21/0274* (2013.01)

(58) Field of Classification Search
CPC ............ G03F 7/004; G03F 7/11; G03F 7/094; C08G 59/223; C08G 59/24; C08G 59/26; C08G 65/263; H01L 21/0274
See application file for complete search history.

(56) References Cited

U.S. PATENT DOCUMENTS

| | | | |
|---|---|---|---|
| 10,437,150 B2* | 10/2019 | Sakamoto | ............... G03F 7/091 |
| 2008/0038678 A1 | 2/2008 | Kishioka et al. | |
| 2011/0230058 A1 | 9/2011 | Sakamoto et al. | |
| 2014/0004465 A1 | 1/2014 | Ohnishi et al. | |
| 2016/0238936 A1 | 8/2016 | Nishita et al. | |
| 2017/0045820 A1 | 2/2017 | Sakaida et al. | |
| 2017/0097568 A1 | 4/2017 | Endo et al. | |
| 2021/0397090 A1* | 12/2021 | Shimizu | .............. H01L 21/0276 |
| 2022/0187707 A1* | 6/2022 | Wakayama | ........... G03F 7/0382 |

FOREIGN PATENT DOCUMENTS

| | | |
|---|---|---|
| WO | 2005/098542 A1 | 10/2005 |
| WO | 2010/061774 A1 | 6/2010 |
| WO | 2012/124597 A1 | 9/2012 |
| WO | 2015/046149 A1 | 4/2015 |
| WO | 2015/151803 A1 | 10/2015 |
| WO | 2015/163195 A1 | 10/2015 |

OTHER PUBLICATIONS

Mar. 23, 2021 International Preliminary Report on Patentability issued in International Patent Application No. PCT/JP2019/038741.
Dec. 3, 2019 International Search Report issued in International Patent Application No. PCT/JP2019/038741.

* cited by examiner

*Primary Examiner* — Geraldina Visconti
(74) *Attorney, Agent, or Firm* — Oliff PLC

(57) ABSTRACT

A composition for forming a resist underlayer film enables the formation of a desired resist pattern; and a method for forming a resist pattern using this resist underlayer film forming composition. A resist underlayer film forming composition contains an organic solvent and a polymer that has a structure represented by formula (1) or (2) at an end of the polymer chain. (In formula (1) and formula (2), X represents a divalent organic group; A represents an aryl group having 6-40 carbon atoms; R1 represents a halogen atom, an alkyl group having 1-40 carbon atoms or an alkoxy group having 1-40 carbon atoms; each of R2 and R3 independently represents a hydrogen atom, an optionally substituted alkyl group having 1-10 carbon atoms, an aryl group having 6-40 carbon atoms or a halogen atom; each of n1 and n3 independently represents an integer of 1-12; and n2 represents an integer of 0-11.)

25 Claims, No Drawings

RESIST UNDERLAYER FILM-FORMING COMPOSITION AND METHOD FOR FORMING RESIST PATTERN USING THE SAME

TECHNICAL FIELD

The present invention relates to a resist underlayer film-forming composition for lithography with the purposes of suppressing worsening of LWR (Line Width Roughness, fluctuation of resist pattern line width) at the time of forming a resist pattern and improving resist sensitivity in a lithography process at the time of manufacturing a semiconductor device, and a method for forming a resist pattern using the resist underlayer film-forming composition.

BACKGROUND ART

Heretofore, in the manufacture of semiconductor devices, fine processing by lithography using a resist composition has been carried out. The above-mentioned fine processing is a processing method, in which a thin film of a photoresist composition is formed onto a semiconductor substrate such as a silicon wafer, etc., an active ray such as an ultraviolet ray is irradiated thereto through a mask pattern, on which a pattern of a device is drawn, the substrate is developed, and subjected to etching treatment using the obtained photoresist pattern as a protective film to create fine unevenness corresponding to the above-mentioned pattern onto the surface of the substrate. In recent years, high degree integration of semiconductor devices has been progressing, and active rays to be used have also been investigated, in addition to the conventionally used i-line (wavelength 365 nm), KrF excimer laser (wavelength 248 nm) and ArF excimer laser (wavelength 193 nm), on practical application of EUV light (wavelength 13.5 nm) for state-of-the-art fine processing. Accompanied with this, diffused reflection of active light from the semiconductor substrate and influence of standing waves have caused a big problem. Thus, in order to solve this problem, a method of providing an antireflection film (Bottom Anti-Reflective Coating: BARC) between the resist and the semiconductor substrate has widely been studied. The antireflection film is also referred to as a resist underlayer film. As such an antireflection film, many studies have been carried out on an organic antireflection film comprising a polymer having a light absorption site, etc., due to easiness of use thereof.

In Patent Literature 1, an antireflection film for semiconductors having a condensation type polymer has been disclosed. In Patent Literature 2, a resist underlayer film for lithography containing a polymer having an optionally substituted aryl ester group at the terminal has been disclosed. In Patent Literature 3, a resist underlayer film-forming composition containing a polymer, in which a sulfonyl group is introduced at the terminal, has been disclosed.

CITATION LIST

Patent Literature

Patent Literature 1: WO 2005/098542
Patent Literature 2: WO 2015/046149
Patent Literature 3: WO 2015/163195

SUMMARY OF INVENTION

Technical Problem

The properties required for a resist underlayer film includes, for example, a property of inhibiting occurrence of intermixing with the resist film formed on the upper layer (being insoluble in the resist solvent), and a faster dry etching rate than that of the resist film.

In the case of lithography accompanied by EUV exposure, the line width of the formed resist pattern becomes 32 nm or less, so that the resist underlayer film for EUV exposure is used by making the film thickness thinner than before. When such a thin film is to be formed, it is difficult to form a uniform film without defects, because pinholes, agglomeration, etc., are likely to occur due to the influence of the substrate surface, the polymer to be used, etc.

On the other hand, when a resist pattern is formed, in the development step, a method including the steps of removing an unexposed portion of the above-mentioned resist film using a solvent capable of dissolving the resist film, usually an organic solvent, and leaving the exposed portion of the resist film as a resist pattern is sometimes employed. In such a negative development process, improvement of adhesiveness of the resist pattern is a major task.

Also, it has been desired to form a resist pattern having a good rectangular shape while suppressing worsening of LWR (Line Width Roughness, fluctuation of line width (roughness)) at the time of forming the resist pattern, as well as to improve resist sensitivity.

An object of the present invention is to provide a composition for forming a resist underlayer film capable of forming a desired resist pattern, in which the above-mentioned problems have been solved, and a resist pattern forming method using the resist underlayer film-forming composition.

Solution to Problem

The present invention embraces the following.

[1]

A resist underlayer film-forming composition, comprising an organic solvent and a polymer having a structure represented by the following formula (1) or (2) at an end of a polymer chain:

[Formula 1]

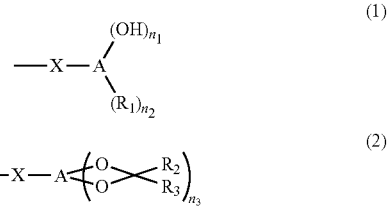

wherein, in formula (1) and formula (2), X represents a divalent organic group; A represents an aryl group having 6 to 40 carbon atoms; $R_1$ represents a halogen atom, an alkyl group having 1 to 10 carbon atoms, an alkoxy group having 1 to 10 carbon atoms; $R_2$ and $R_3$ each independently represent a hydrogen atom, a halogen atom, an alkyl group having 1 to 10 carbon atoms which may be substituted or an aryl group having 6 to 40 carbon atoms which may be substituted; n1 and n3 each independently represent an integer of 1 to 12, and n2 represents an integer of 0 to 11.

[2]

The resist underlayer film-forming composition according to [1], wherein X in formula (1) and formula (2) is an ester bond or an ether bond.

[3]

The resist underlayer film-forming composition according to [1], wherein A in formula (1) and formula (2) is a phenyl group, a naphthyl group or an anthracenyl group.

[4]

The resist underlayer film-forming composition according to [1], wherein $R_2$ and $R_3$ in formula (2) are hydrogen atoms.

[5]

The resist underlayer film-forming composition according to [1], wherein n2 in formula (1) is 0.

[6]

The resist underlayer film-forming composition according to [1], wherein the polymer has a structural unit represented by the following formula (3).

[Formula 2]

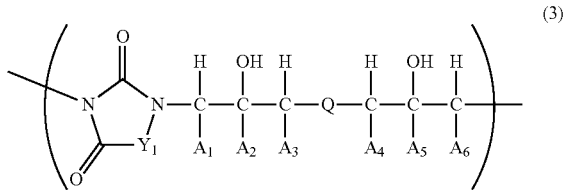
(3)

wherein, in formula (3), $A_1$, $A_2$, $A_3$, $A_4$, $A_5$ and $A_6$ each independently represent a hydrogen atom, a methyl group or an ethyl group; $Y_1$ represents formula (4), formula (5), formula (6) or formula (7):

[Formula 3]

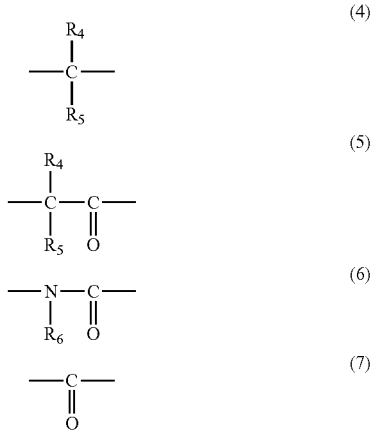

(4)

(5)

(6)

(7)

wherein, in formula (4) to (7), $R_4$ and $R_5$ each independently represent a hydrogen atom, an alkyl group having 1 to 6 carbon atoms, an alkenyl group having 3 to 6 carbon atoms, a benzyl group or a phenyl group, and the phenyl group may be substituted with at least one group selected from the group consisting of an alkyl group having 1 to 6 carbon atoms, a halogen atom, an alkoxy group having 1 to 6 carbon atoms, a nitro group, a cyano group, a hydroxy group and an alkylthio group having 1 to 6 carbon atoms; $R_4$ and $R_5$ may be bonded to each other to form a ring having 3 to 6 carbon atoms; $R_6$ represents an alkyl group having 1 to 6 carbon atoms, an alkenyl group having 3 to 6 carbon atoms, a benzyl group or a phenyl group, and the phenyl group may be substituted with at least one group selected from the group consisting of an alkyl group having 1 to 6 carbon atoms, a halogen atom, an alkoxy group having 1 to 6 carbon atoms, a nitro group, a cyano group, a hydroxy group and an alkylthio group having 1 to 6 carbon atoms; and Q represents formula (8) or formula (9):

[Formula 4]

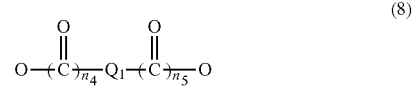
(8)

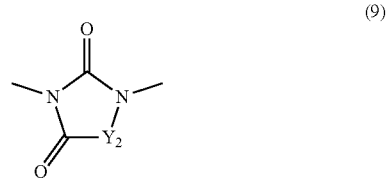
(9)

wherein, in formulae (8) and (9), $Q_1$ represents an alkylene group having 1 to 10 carbon atoms, a phenylene group, a naphthylene group or an anthrylene group, and the phenylene group, the naphthylene group and the anthrylene group each may be substituted with at least one group selected from the group consisting of an alkyl group having 1 to 6 carbon atoms, a halogen atom, an alkoxy group having 1 to 6 carbon atoms, a nitro group, a cyano group, a hydroxy group and an alkylthio group having 1 to 6 carbon atoms; n4 and n5 each independently represent an integer of 0 or 1; and $Y_2$ represents formula (4), formula (5) or formula (7).

[7]

The resist underlayer film-forming composition according to [6], wherein the polymer having the structural unit represented by formula (3) is a polymer obtained by a reaction of a compound represented by formula (10) and a compound represented by formula (11).

[Formula 5]

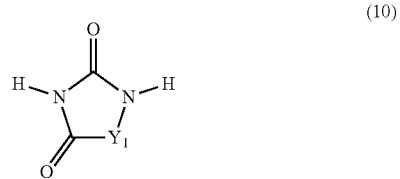
(10)

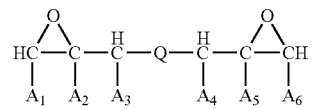
(11)

wherein, in formulae (10) and (11), $A_1$, $A_2$, $A_3$, $A_4$, $A_5$, $A_6$, $Y_1$ and Q have the same meaning as defined in [6].

[8]

The resist underlayer film-forming composition according to [6], wherein the polymer having the structural unit represented by formula (3) above is a polymer obtained by a reaction of a compound represented by formula (12) with a compound represented by formula (13).

[Formula 6]

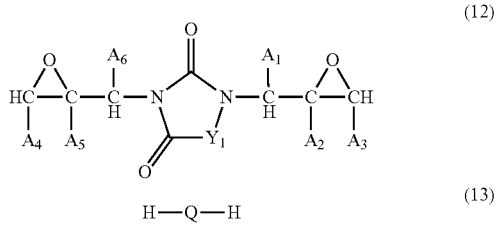

(12)

H—Q—H  (13)

wherein, in the formula, $A_1$, $A_2$, $A_3$, $A_4$, $A_5$, $A_6$, $Y_1$ and Q have the same meaning as defined in [6].

[9]

The resist underlayer film-forming composition according to any one of [1] to [8], further comprising a cross-linking acid catalyst.

[10]

The resist underlayer film-forming composition according to any one of [1] to [9], further comprising a cross-linking agent.

[11]

A resist underlayer film which is a baked product of a coating film comprising the resist underlayer film-forming composition according to any one of [1] to [10]. [12]

A method for producing a patterned substrate, comprising the steps of:
applying the resist underlayer film-forming composition according to any one of [1] to [10] onto a semiconductor substrate and baking the applied composition to form a resist underlayer film,
applying a resist onto the resist underlayer film and baking the applied resist to form a resist film,
subjecting the semiconductor substrate covered with the resist underlying film and the resist to exposure, and
subjecting the exposed resist film to development to perform patterning.

[13]

A method for producing a semiconductor device, comprising the steps of:
forming a resist underlayer film comprising the resist underlayer film-forming composition according to any one of [1] to [10] on a semiconductor substrate,
forming a resist film on the resist underlayer film,
irradiating the resist film with a light or an electron beam and subjecting the resultant resist film to development to form a resist pattern,
etching the resist underlayer film through the formed resist pattern to form a patterned resist underlayer film, and
processing the semiconductor substrate using the patterned resist underlying film.

Advantageous Effects of Invention

The resist underlayer film-forming composition for lithography of the present invention is characterized in that one or more ends of the polymer contained in the resist underlayer film-forming composition are capped with the structure represented by the above-mentioned formula (1) or (2), and it is a composition containing such a polymer and an organic solvent, preferably further comprising a cross-linking agent and/or a compound which promotes cross-linking reaction. Attributable to these features, the resist underlayer film-forming composition for lithography of the present application can accomplish prevention of the deterioration of LWR at the time of forming the resist pattern and improvement in sensitivity.

DESCRIPTION OF EMBODIMENTS

<Resist Underlayer Film-Forming Composition>

The resist underlayer film-forming composition of the present application contains an organic solvent and a polymer having a structure represented by the following formula (1) or (2) at the end of the polymer chain.

[Formula 7]

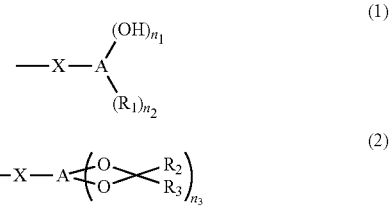

(in the above-mentioned formula (1) and formula (2), X represents a divalent organic group; A represents an aryl group having 6 to 40 carbon atoms; $R_1$ represents a halogen atom, an alkyl group having 1 to 40 carbon atoms or an alkoxy group having 1 to 40 carbon atoms; $R_2$ and $R_3$ each independently represent a hydrogen atom, a halogen atom, an alkyl group having 1 to 10 carbon atoms which may be substituted or an aryl group having 6 to 40 carbon atoms which may be substituted; n1 and n3 each independently represent an integer of 1 to 12, and n2 represents an integer of 0 to 11.)

Specific examples of the above-mentioned X are an ester bond, an ether bond, an amide bond, a urethane bond or a urea bond, and of these, an ester bond or an ether bond is preferable.

Specific examples of the above-mentioned A are a group derived from benzene, naphthalene, anthracene, phenanthrene or pyrene, and of these, a group derived from benzene, naphthalene or anthracene is preferable.

The above-mentioned halogen atom includes a fluorine atom, a chlorine atom, a bromine atom and an iodine atom.

Specific examples of the above-mentioned alkyl group having 1 to 10 carbon atoms are a methyl group, an ethyl group, a propyl group, a butyl group, a hexyl group and a pentyl group, and of these, a methyl group is preferable.

Specific examples of the above-mentioned alkoxy group having 1 to 10 carbon atoms are a methoxy group, an ethoxy group, a propoxy group, a butoxy group, a hexoxy group and a pentoxy group, and of these, a methoxy group is preferable.

The above-mentioned "which may be substituted" means that a part or all of hydrogen atoms of the above-mentioned alkyl group having 1 to 10 carbon atoms may be substituted with, for example, a fluoro group or a hydroxy group.

Specific examples of the above-mentioned alkyl group having 1 to 10 carbon atoms include a methyl group, an ethyl group, a propyl group, a butyl group, a hexyl group and a pentyl group, and preferably a methyl group.

Specific examples of the aryl group having 6 to 40 carbon atoms include a benzyl group, a naphthyl group, an anthracenyl group, a phenanthrenyl group and a pyrenyl group, and of these, a phenyl group is preferable.

n1 and n3 each independently represent an integer of 1 to 12, and preferably an integer of 1 to 6.

n2 represents an integer of 0 to 11, and preferably an integer of 0 to 2.

In the above-mentioned formula (2), $R_2$ and $R_3$ are preferably hydrogen atoms.

In the above-mentioned formula (1), n2 is preferably 0.

The compound having the partial structure represented by the above-mentioned formula (1) is, for example, represented by the following formula (1-1).

[Formula 8]

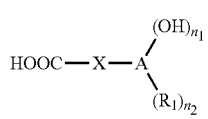

(1-1)

(in the above-mentioned formula (1-1), X represents a divalent organic group; A represents an aryl group having 6 to 40 carbon atoms; $R_1$ represents a halogen atom, an alkyl group having 1 to 40 carbon atoms or an alkoxy group having 1 to 40 carbon atoms; n1 is an integer of 1 to 12, and n2 is an integer of 0 to 11.)

In the above-mentioned formula (1-1), preferable X, A, $R_1$, n1 and n2 for the present invention are each as mentioned above.

Specific examples of the compound represented by the above-mentioned formula (1-1) are as follows.

By reacting the following compound with one or more terminals of the polymer according to the method known per se, a polymer to be contained in the resist underlayer film-forming composition of the present application may be produced.

[Formula 9]

Formula (A-1)

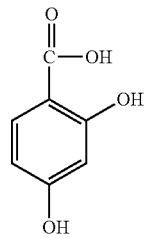

Formula (A-2)

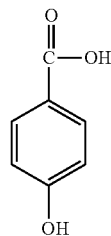

Formula (A-3)

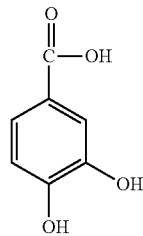

Formula (A-4)

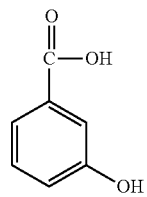

Formula (A-5)

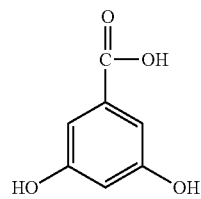

Formula (A-6)

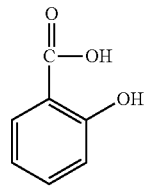

Formula (A-7)

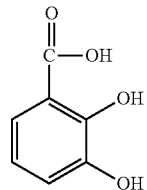

Formula (A-8)

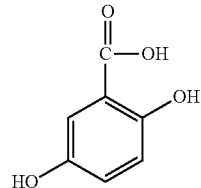

Formula (A-9)

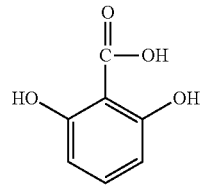

Formula (A-10)
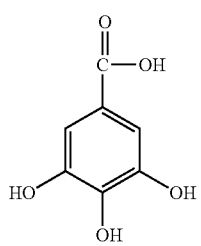
Formula (A-11)
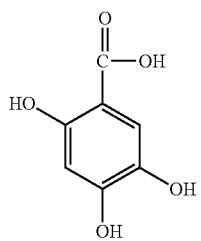
Formula (A-12)
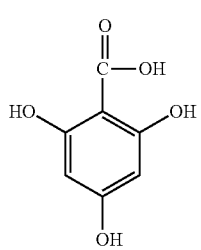
Formula (A-13)
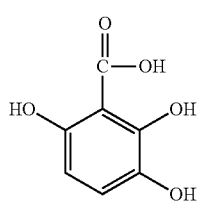
Formula (A-14)
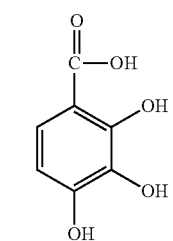
[Formula 10]
Formula (A-15)
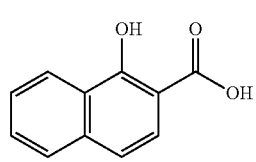
Formula (A-16)
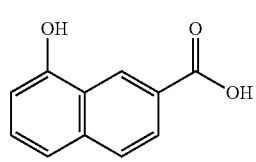
Formula (A-17)
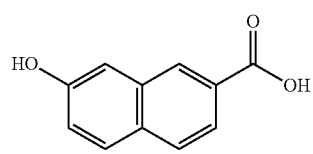
Formula (A-18)
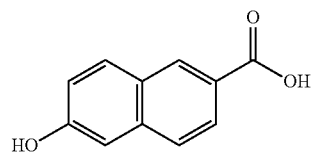
Formula (A-19)
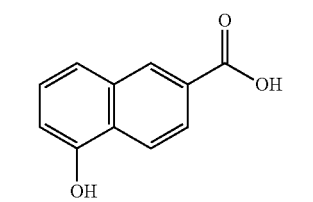
Formula (A-20)
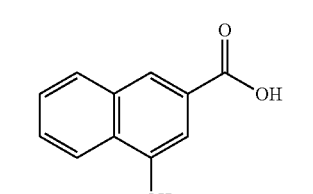
Formula (A-21)
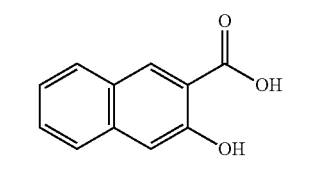
Formula (A-22)
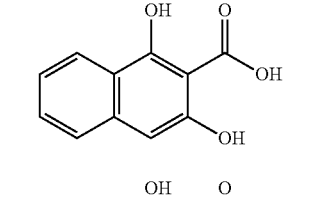
Formula (A-23)
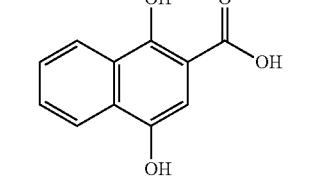
Formula (A-24)
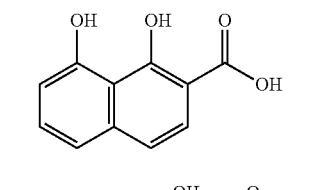
Formula (A-25)
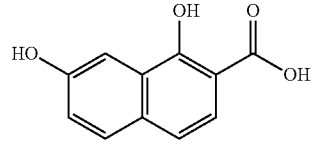

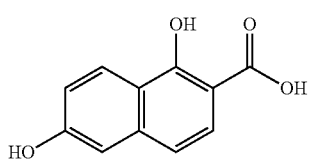
Formula (A-26)
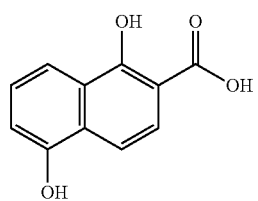
Formula (A-27)
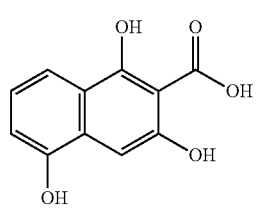
Formula (A-28)
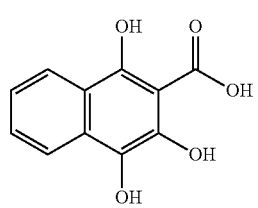
Formula (A-29)
[Formula 11]
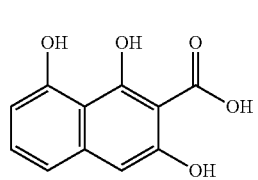
Formula (A-30)
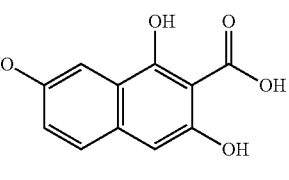
Formula (A-31)
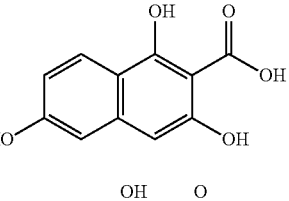
Formula (A-32)
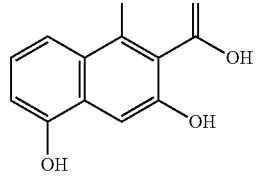
Formula (A-33)
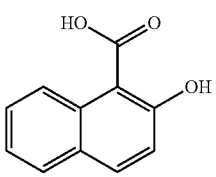
Formula (A-34)
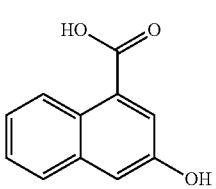
Formula (A-35)
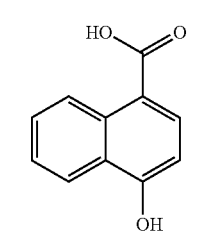
Formula (A-36)
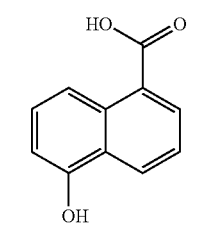
Formula (A-37)
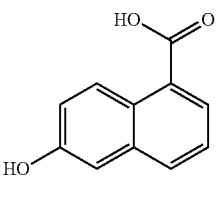
Formula (A-38)
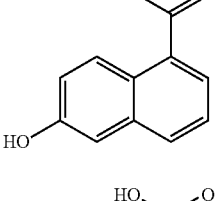
Formula (A-39)
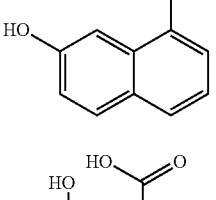
Formula (A-40)
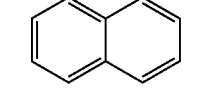
Formula (A-41)

-continued
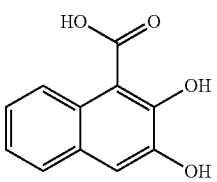
Formula (A-42)
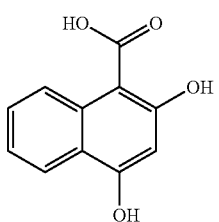
Formula (A-43)
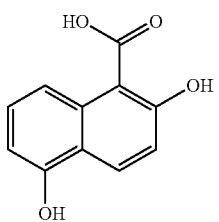
Formula (A-44)
[Formula 12]
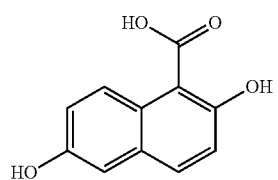
Formula (A-45)
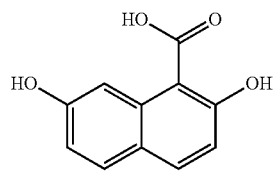
Formula (A-46)
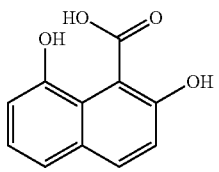
Formula (A-47)
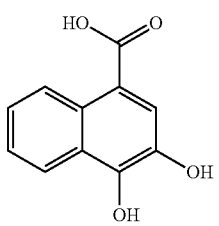
Formula (A-48)
-continued
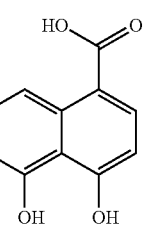
Formula (A-49)
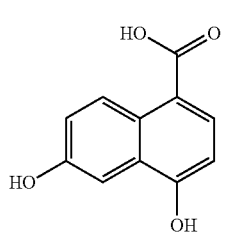
Formula (A-50)
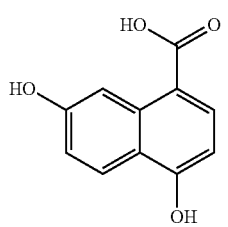
Formula (A-51)
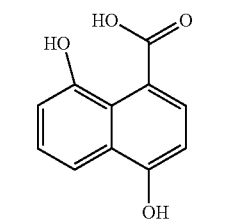
Formula (A-52)
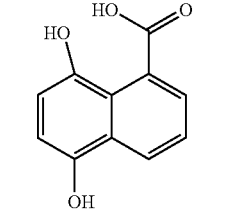
Formula (A-53)
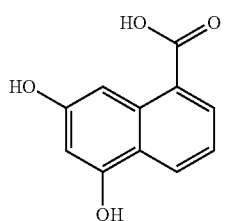
Formula (A-54)
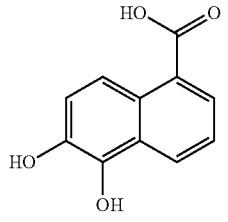
Formula (A-55)

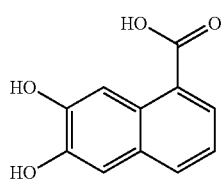 Formula (A-56)
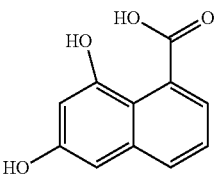 Formula (A-57)
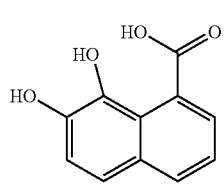 Formula (A-58)
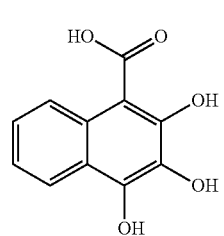 Formula (A-59)
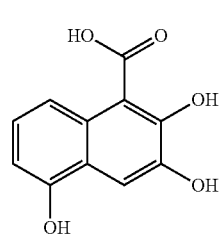 Formula (A-60)
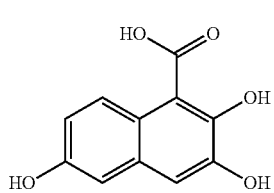 Formula (A-61)
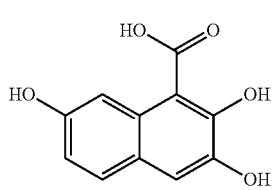 Formula (A-62)
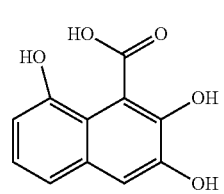 Formula (A-63)
[Formula 13]
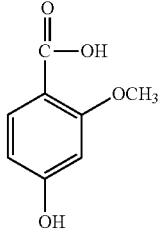 Formula (A-78)
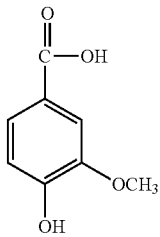 Formula (A-79)
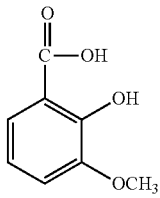 Formula (A-80)
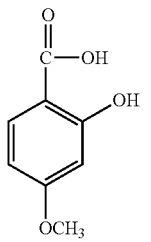 Formula (A-81)
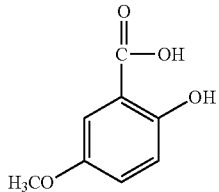 Formula (A-82)
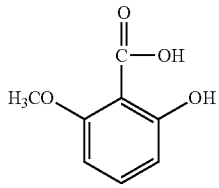 Formula (A-83)
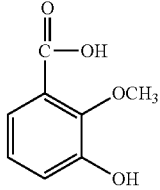 Formula (A-84)

-continued
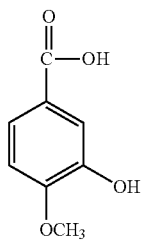
Formula (A-85)
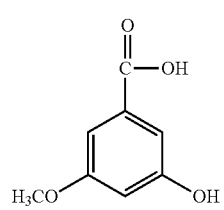
Formula (A-86)
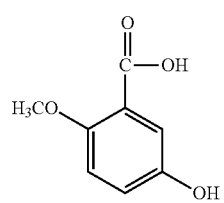
Formula (A-87)
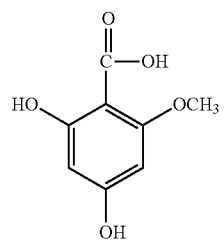
Formula (A-88)
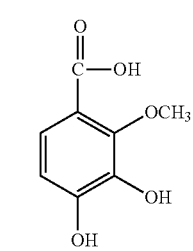
Formula (A-89)
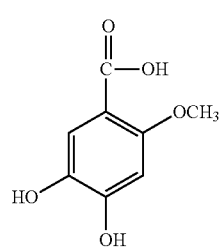
Formula (A-90)
[Formula 14]
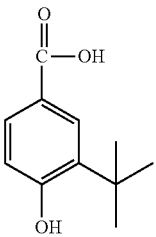
Formula (A-91)
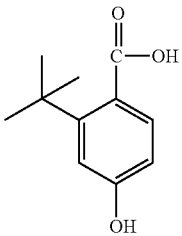
Formula (A-92)
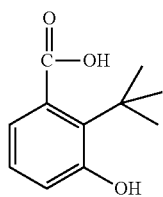
Formula (A-93)
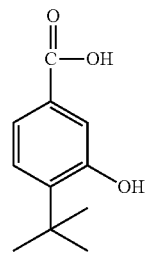
Formula (A-94)
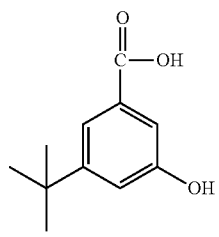
Formula (A-95)
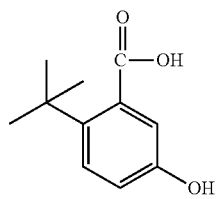
Formula (A-96)
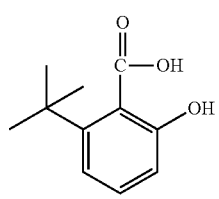
Formula (A-97)

Formula (A-98)

Formula (A-99)

Formula (A-100)

Formula (A-101)

Formula (A-102)

The compound having the partial structure represented by the above-mentioned formula (2) may be represented by, for example, the following formula (2-1).

[Formula 15]

$$HOOC-X-A\left(\begin{array}{c}O\\O\end{array}\right\rangle\begin{array}{c}R_2\\R_3\end{array}\right)_{n_3}\quad(2\text{-}1)$$

(in the above-mentioned formula (2-1), X represents a divalent organic group; A represents an aryl group having 6 to 40 carbon atoms; $R_2$ and $R_3$ each independently represent a hydrogen atom, an alkyl group having 1 to 10 carbon atoms which may be substituted, an aryl group having 6 to 40 carbon atoms which may be substituted or a halogen atom; and n3 represents an integer of 1 to 12.)

In the above-mentioned formula (2-1), preferable X, A, $R_2$, $R_3$ and n3 for the present invention are each as mentioned above.

Specific examples of the compound represented by the above-mentioned formula (2-1) are as follows.

By reacting the following compound with one or more terminals of the polymer according to the method known per se, a polymer to be contained in the resist underlayer film-forming composition of the present application may be produced.

[Formula 16]

Formula (A-64)

Formula (A-65)

Formula (A-66)

Formula (A-67)

Formula (A-68)

Formula (A-69)

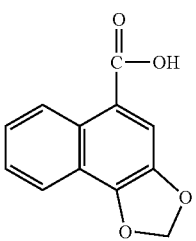

Formula (A-70)

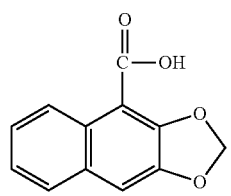

Formula (A-71)

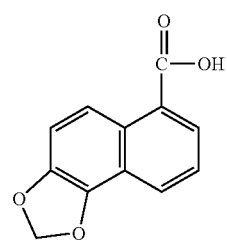

Formula (A-72)

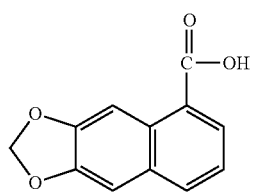

Formula (A-73)

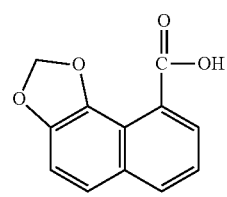

Formula (A-74)

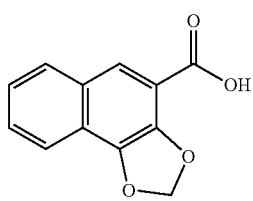

Formula (A-75)

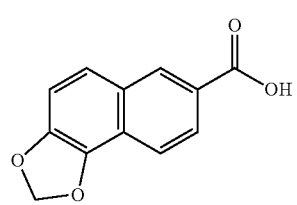

Formula (A-76)

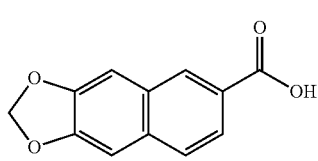

Formula (A-77)

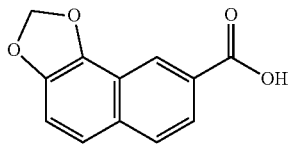

The above-mentioned polymer is not particularly limited as long as it is a polymer known per se used in the resist underlayer film-forming compositions. Specifically, it includes a vinyl-polymerized polymer from the reaction of olefins, a polyamide, a polyester, a polycarbonate and a polyurethane; and it preferably has a structural unit represented by the following formula (3).

[Formula 17]

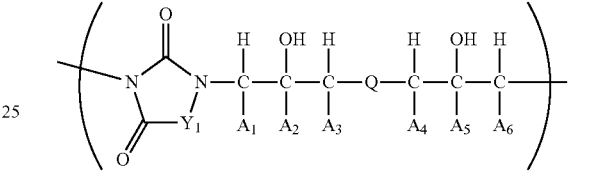

(3)

(in formula (3), $A_1$, $A_2$, $A_3$, $A_4$, $A_5$ and $A_6$ each independently represent a hydrogen atom, a methyl group or an ethyl group; $Y_1$ represents formula (4), formula (5), formula (6) or formula (7):

[Formula 18]

 (4)

 (5)

 (6)

 (7)

((in formula (4) to (7), $R_4$ and $R_5$ each independently represent a hydrogen atom, an alkyl group having 1 to 6 carbon atoms, an alkenyl group having 3 to 6 carbon atoms, a benzyl group or a phenyl group, and the phenyl group may be substituted with at least one group selected from the group consisting of an alkyl group having 1 to 6 carbon atoms, a halogen atom, an alkoxy group having 1 to 6 carbon atoms, a nitro group, a cyano group, a hydroxy group and an alkylthio group having 1 to 6 carbon atoms, and $R_4$ and $R_5$ may be bonded to each other to form a ring having 3 to 6 carbon atoms; and $R_6$ represents an alkyl group having 1 to 6 carbon atoms, an alkenyl group having 3 to 6 carbon atoms, a benzyl group or a phenyl group, and the phenyl group may be substituted with at least one group selected from the group consisting of an alkyl group having 1 to 6 carbon atoms, a halogen atom, an alkoxy group having 1 to 6 carbon atoms, a nitro group, a cyano group, a hydroxy group and an alkylthio group having 1 to 6 carbon atoms); and Q represents formula (8) or formula (9):

[Formula 19]

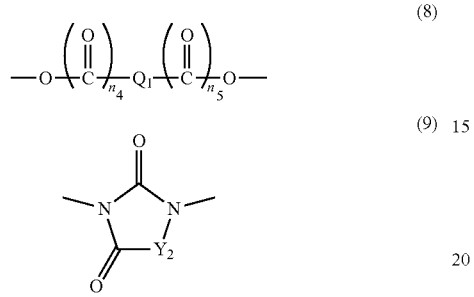

(in formulae (8) and (9), $Q_1$ represents an alkylene group having 1 to 10 carbon atoms, a phenylene group, a naphthylene group or an anthrylene group, and the phenylene group, the naphthylene group and the anthrylene group each may be substituted with at least one group selected from the group consisting of an alkyl group having 1 to 6 carbon atoms, a halogen atom, an alkoxy group having 1 to 6 carbon atoms, a nitro group, a cyano group, a hydroxy group and an alkylthio group having 1 to 6 carbon atoms; n4 and n5 each independently represent a number of 0 or 1; and $Y_2$ represents formula (4), formula (5) or formula (7)))

Specific examples of the above-mentioned alkyl group having 1 to 6 carbon atoms include a methyl group, an ethyl group, a propyl group, a butyl group, a hexyl group and a pentyl group, and preferably a methyl group.

Specific examples of the above-mentioned alkenyl group having 3 to 6 carbon atoms are a group derived from propylene, isobutylene or amylene, and preferably a propenyl group.

Specific examples of the above-mentioned alkoxy group having 1 to 6 carbon atoms are a methoxy group, an ethoxy group, a propoxy group, a butoxy group, a hexoxy group and a pentoxy group, and preferably a methoxy group.

Specific examples of the above-mentioned alkylthio group having 1 to 6 carbon atoms are a group derived from dimethylsulfide, diethylsulfide, dimethyldisulfide and diethyldisulfide, and preferably a group derived from diethyldisulfide.

Specific examples of the above-mentioned ring having 3 to 6 carbon atoms are a cyclopropane ring, a cyclobutane ring, a cyclohexane ring and a thiophene ring.

Specific examples of the above-mentioned alkylene group having 1 to 10 carbon atoms are a methylene group, an ethylene group, a propylene group, a butylene group, a hexylene group, a pentylene group, a heptylene group, an octylene group, a nonylene group and a decylene group, and preferably a methylene group, an ethylene group, a propylene group and a butylene group.

The above-mentioned polymer may be used by reacting a compound having a specific structure with the end of the polymer described in JP 2005/098542A.

The polymer contained in the resist underlayer film-forming composition of the present application may be obtained by reacting a compound having a specific structure with the end of a copolymer from the reaction between a compound represented by formula (10) and a compound represented by formula (11).

The polymer contained in the resist underlayer film-forming composition of the present application may be a reaction product of a mixture of a compound represented by the following formula (10), a compound represented by the following formula (11), and a compound represented by the above-mentioned formula (1-1) or formula (2-1).

[Formula 20]

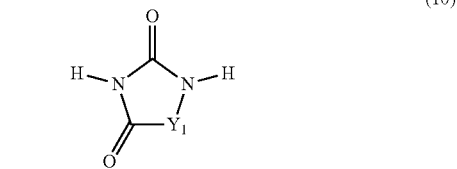

(in formula (10), $A_1$, $A_2$, $A_3$, $A_4$, $A_5$ and $A_6$ each independently represent a hydrogen atom, a methyl group or an ethyl group; $Y_1$ represents formula (4), formula (5), formula (6) or formula (7):

[Formula 21]

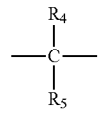

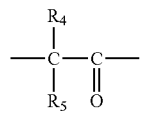

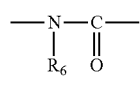

((in formula (4) to (7), $R_4$ and $R_5$ each independently represent a hydrogen atom, an alkyl group having 1 to 6 carbon atoms, an alkenyl group having 3 to 6 carbon atoms, a benzyl group or a phenyl group, and the phenyl group may be substituted with at least one group selected from the group consisting of an alkyl group having 1 to 6 carbon atoms, a halogen atom, an alkoxy group having 1 to 6 carbon atoms, a nitro group, a cyano group, a hydroxy group and an alkylthio group having 1 to 6 carbon atoms, and $R_4$ and $R_5$ may be bonded to each other to form a ring having 3 to 6 carbon atoms; and $R_6$ represents an alkyl group having 1 to 6 carbon atoms, an alkenyl group having 3 to 6 carbon atoms, a benzyl group or a phenyl group, and the phenyl group may be substituted with at least one group selected from the group consisting of an alkyl group having 1 to 6 carbon atoms, a halogen atom, an alkoxy group having 1 to 6 carbon atoms, a nitro group, a cyano group, a hydroxy group and an alkylthio group having 1 to 6 carbon atoms), and Q represents formula (8) or formula (9):

[Formula 22]

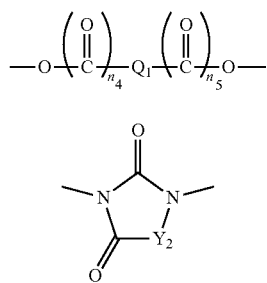

(in formulae (8) and (9), $Q_1$ represents an alkylene group having 1 to 10 carbon atoms, a phenylene group, a naphthylene group or an anthrylene group, and the phenylene group, the naphthylene group and the anthrylene group each may be substituted with at least one group selected from the group consisting of an alkyl group having 1 to 6 carbon atoms, a halogen atom, an alkoxy group having 1 to 6 carbon atoms, a nitro group, a cyano group, a hydroxy group and an alkylthio group having 1 to 6 carbon atoms; n4 and n5 each independently represent a number of 0 or 1; and $Y_2$ represents formula (4), formula (5) or formula (7))).

Specific examples of the above-mentioned alkyl group having 1 to 6 carbon atoms are a methyl group, an ethyl group, a propyl group, a butyl group, a hexyl group and a pentyl group, and preferably a methyl group.

Specific examples of the above-mentioned alkenyl group having 3 to 6 carbon atoms are a group derived from propylene, isobutylene and amylene, and preferably a propenyl group.

Specific examples of the above-mentioned alkoxy group having 1 to 6 carbon atoms are a methoxy group, an ethoxy group, a propoxy group, a butoxy group, a hexoxy group and a pentoxy group, and preferably a methoxy group.

Specific examples of the above-mentioned alkylthio group having 1 to 6 carbon atoms are a group derived from dimethylsulfide, diethylsulfide, dimethyldisulfide and diethyldisulfide, and preferably a group derived from diethyldisulfide.

Specific examples of the above-mentioned ring having 3 to 6 carbon atoms are a cyclopropane ring, a cyclobutane ring, a cyclohexane ring and a thiophene ring.

Specific examples of the above-mentioned alkylene group having 1 to 10 carbon atoms are a methylene group, an ethylene group, a propylene group, a butylene group, a hexylene group, a pentylene group, a heptylene group, an octylene group, a nonylene group and a decylene group, and preferably a methylene group, an ethylene group, a propylene group and a butylene group.

The polymer contained in the resist underlayer film-forming composition of the present application may be obtained by reacting a compound having a specific structure with the terminal of a copolymer from the reaction between a compound represented by formula (12) and a compound represented by formula (13).

The polymer contained in the resist underlayer film-forming composition of the present application may be a polymer obtained by a reaction of a mixture of a compound represented by formula (12), a compound represented by formula (13) and a compound represented by the above-mentioned formula (1-1) or formula (2-1).

[Formula 23]

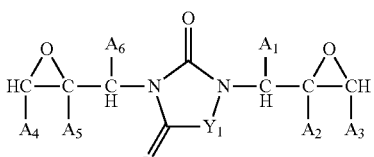

(in the formula, $A_1$, $A_2$, $A_3$, $A_4$, $A_5$, $A_6$, $Y_1$ and Q each represent the same meanings as defined above)

The ratio of the polymer in the solid content of the resist underlayer film-forming composition of the present invention is 50% by mass or more, preferably 60% by mass or more, and for example, it is within the range of 50 to 100% by mass, or 60 to 99% by mass, or 70 to 95% by mass. And the ratio of the solid content in the resist underlayer film-forming composition of the present invention is not particularly limited as long as each component is uniformly dissolved in a solvent, and for example, it is within the range of 0.5 to 50% by mass, or 1 to 30% by mass, or 3 to 20% by mass. Here, the solid content means a content in which the solvent component is removed from all the components of the resist underlayer film-forming composition.

The molecular weight of the polymer contained in the resist underlayer film-forming composition of the present invention is, as a weight average molecular weight, for example, within the range of 1,000 to 200,000, or 1,200 to 100,000, or 1,500 to 30,000, or 2,000 to 20,000, or 2,000 to 4,000.

The weight average molecular weight may be obtained by, for example, the gel permeation chromatography (GPC) measurement method described in Examples.

<Producing Method of Polymer>

As an example of the polymerization method, the polymer contained in the resist underlayer film-forming composition of the present application may be synthesized by adding a polymerization catalyst to a mixture of a compound represented by the following formula (10), a compound represented by the following formula (11), and a compound represented by the above-mentioned formula (1-1) or formula (2-1), and subjecting the mixture to heat polymerization. As an example of the polymerization method, the polymer contained in the resist underlayer film-forming composition of the present application may be synthesized by adding a polymerization catalyst to a mixture of a compound represented by formula (12), a compound represented by formula (13), and a compound represented by the above-mentioned formula (1-1) or formula (2-1), and subjecting the mixture to heat polymerization. The organic solvent herein used may be optionally selected from the enumeration of preferable organic solvents contained in the resist underlayer film-forming composition for lithography of the present invention mentioned later. The polymerization catalyst includes, for example, benzyltriethylammonium chloride and ethyltriphenylphosphonium bromide. The polymerization may be carried out, for example, by heating to 50° C. to 160° C., and preferably 70° C. to 130° C. The reaction time is, for example, within the range of 1 hour to 100 hours, and preferably 2 hours to 48 hours.

<Organic Solvent>

Specific examples of the organic solvent contained in the resist underlayer film of the present application are ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monomethyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, and butyl lactate, and the like, and most preferably a mixed solvent of propylene glycol monomethyl ether and propylene glycol monomethyl ether acetate.

<Cross-Linking Acid Catalyst>

The resist underlayer film-forming composition of the present application may further contain a cross-linking acid catalyst. The cross-linking acid catalyst is a heat acid generating agent, and specific examples thereof include sulfonic acid compounds and carboxylic acid compounds such as p-toluenesulfonic acid, trifluoromethanesulfonic acid, pyridinium-p-toluenesulfonate, salicylic acid, camphorsulfonic acid, 5-sulfosalicylic acid, 4-chlorobenzenesulfonic acid, 4-hydroxybenzenesulfonic acid, benzenedisulfonic acid, 1-naphthalenesulfonic acid, p-phenolsulfonic acid pyridinium salt, citric acid, benzoic acid, hydroxybenzoic acid and the like.

The resist underlayer film-forming composition of the present application may contain a cross-linking agent. The cross-linking agent means a nitrogen-containing compound having at least two cross-linking forming substituents (for example, a methylol group, a methoxymethyl group, a butoxymethyl group), and specific examples thereof include hexamethoxymethylmelamine, tetramethoxymethylbenzoguanamine, 1,3,4,6-tetrakis(methoxymethyl)glycoluril, 1,3,4,6-tetrakis(butoxymethyl)glycoluril, 1,3,4,6-tetrakis(hydroxymethyl)glycoluril, 1,3-bis(hydroxymethyl)urea, 1,1,3,3-tetrakis(butoxymethyl)urea and 1,1,3,3-tetrakis(methoxymethyl)urea.

<Resist Underlayer Film>

The resist underlayer film according to the present invention may be produced by applying the above-mentioned resist underlayer film-forming composition onto a semiconductor substrate and baking the same.

The semiconductor substrate onto which the resist underlayer film-forming composition of the present invention is applied incudes, for example, silicon wafers, germanium wafers, and compound semiconductor wafers such as gallium arsenide, indium phosphate, gallium nitride, indium nitride, aluminum nitride and the like.

When a semiconductor substrate on the surface of which has been formed an inorganic film is used, the inorganic film is formed by, for example, ALD (atomic layer deposition) method, CVD (chemical vapor deposition) method, reactive sputtering method, ion plating method, vacuum deposition method or spin coating method (spin-on-glass: SOG). The above-mentioned inorganic film includes, for example, a polysilicon film, a silicon oxide film, a silicon nitride film, a BPSG (Boro-Phospho Silicate Glass) film, a titanium nitride film, a titanium oxynitride film, a tungsten film, a gallium nitride film and a gallium arsenide film.

The resist underlayer film-forming composition of the present invention is applied onto such a semiconductor substrate by a suitable application method such as a spinner, a coater or the like. Thereafter, baking of the same using a heating means such as a hot plate or the like gives a resist underlayer film. The baking conditions are appropriately selected from a baking temperature of 100° C. to 400° C. and a baking time of 0.3 minute to 60 minutes. The baking temperature is preferably within the range of 120° C. to 350° C. and a baking time is within the range of 0.5 minute to 30 minutes, and a baking temperature is more preferably within the range of 150° C. to 300° C. and a baking time is within the range of 0.8 minute to 10 minutes.

The film thickness of the resist underlayer film to be formed is, for example, within the range of 0.001 μm (1 nm) to 10 μm, preferably 0.002 μm (2 nm) to 1 μm, and more preferably 0.005 μm (5 nm) to 0.5 μm (500 nm). If the temperature at the time of baking is lower than the above-mentioned range, cross-linking may sometimes be insufficient. On the other hand, if the temperature at the time of baking is higher than the above-mentioned range, the resist underlayer film may sometimes be decomposed by heat.

<Producing Method of Patterned Substrate and Manufacturing Method of Semiconductor Device>

The producing method of a patterned substrate goes through the following steps. In general, a photoresist film is formed on a resist underlayer film. The photoresist formed by applying and baking on the resist underlayer film by a method known per se is not particularly limited as long as it is sensitive to light used for exposure. Either a negative-type photoresist or a positive-type photoresist may be used. There are a positive-type photoresist comprising a novolac resin and 1,2-naphthoquinonediazide sulfonic acid ester; a chemical amplification type photoresist comprising a binder having a group that decomposes with an acid to increase an alkali dissolution rate and a photoacid generator; a chemical amplification type photoresist comprising a low molecule compound that decomposes with an acid to increase an alkali dissolution rate of the photoresist, an alkali-soluble binder and a photoacid generator; and a chemical amplification type photoresist comprising a binder having a group that decomposes with an acid to increase an alkali dissolution rate, a low molecule compound that decomposes with an acid to increase an alkali dissolution rate of the photoresist and a photoacid generator, and a resist containing a metal element. Such photoresists include, for example, a product name of V146G available from JSR Corporation, a product name of APEX-E available from Shipley Company, LLC, a product name of PAR710 available from Sumitomo Chemical Co., Ltd., and product names of AR2772, SEPR430, etc., available from Shin-Etsu Chemical Co., Ltd. They also include, for example, fluorine atom-containing polymer-based photoresists as disclosed in Proc. SPIE, Vol. 3999, 330-334 (2000), Proc. SPIE, Vol. 3999, 357-364 (2000), and Proc. SPIE, Vol. 3999, 365-374 (2000).

The exposure is carried out through a mask (reticle) for forming a predetermined pattern, and for example, i-line, KrF excimer laser, ArF excimer laser, EUV (extreme ultraviolet) or EB (electron beam) is used. For the development, an alkaline developer is used, and it is appropriately selected from a development temperature within the range of 5° C. to 50° C. and a development time within the range of 10 seconds to 300 seconds. The alkaline developer that may be used incudes, for example, an aqueous solution of alkalis including inorganic alkalis such as sodium hydroxide, potassium hydroxide, sodium carbonate, sodium silicate, sodium metasilicate, aqueous ammonia, etc., primary amines such as ethylamine, n-propylamine, etc., secondary amines such as diethylamine, di-n-butylamine, etc., tertiary amines such as triethylamine, methyldiethylamine, etc., alcohol amines such as dimethylethanolamine, triethanolamine, etc., quaternary ammonium salts such as tetramethylammonium hydroxide, tetraethylammonium hydroxide, choline, etc., cyclic amines such as pyrrole, piperidine, etc. Further, an appropriate amount of alcohols such as isopropyl alcohol, etc., surfactants such as nonionic, etc., may be added to the above-mentioned aqueous solution of the alkali with an appropriate amount before use. Of these, preferable developer is a quaternary ammonium salt, and further preferably tetramethylammonium hydroxide and choline. Moreover, a surfactant, etc., may be added to these developers. Instead of the alkaline developer, it is also possible to use a method in which development is carried out with an organic solvent such as butyl acetate, etc., so that a portion of the photoresist at which the alkali dissolution rate is not improved is developed. Through the above-mentioned steps, a substrate in which the above-mentioned resist has been subjected to patterning may be produced.

Then, using the formed resist pattern as a mask, the above-mentioned resist underlayer film is subjected to dry etching. At that time, when the above-mentioned inorganic film has been formed onto the surface of the used semiconductor substrate, the surface of the inorganic film is exposed, and when the above-mentioned inorganic film has not been formed onto the surface of the used semiconductor substrate, the surface of the semiconductor substrate is exposed. Thereafter, through the step of processing the substrate by a method known per se (dry etching method, etc.), a semiconductor device may be manufactured.

EXAMPLES

Hereinafter the present invention will be explained in detail by referring to Synthetic Examples and Examples, but the present invention is not limited to the following descriptions.

The weight average molecular weights shown in the following Synthetic

Example 1 to Synthetic Example 7 of the present specification are measurement results by gel permeation chromatography (hereinafter abbreviated to as GPC in the present specification.). For the measurement, a GPC device manufactured by TOSOH CORPORATION is used, and the measurement conditions are as follows. In addition, the dispersity shown in the following Synthetic Examples of the present specification is calculated from the measured weight average molecular weight and number average molecular weight.

GPC column: Shodex [registered trademark]•Asahipak [registered trademark] (SHOWADENKO K. K.)
Column temperature: 40° C.
Solvent: tetrahydrofuran (THF)
Flow rate: 0.6 ml/min
Standard sample: polystyrene (manufactured by TOSOH CORPORATION)
Detector: RI detector (manufactured by TOSOH CORPORATION, RI-8020)

Synthetic Example 1

7.50 g of diglycidyldimethylhydantoin (available from SHIKOKU CHEMICALS CORPORATION), 4.61 g of monoallyldiglycidyl isocyanuric acid (available from SHIKOKU CHEMICALS CORPORATION), 1.34 g of 3-hydroxybenzoic acid (available from TOKYO CHEMICAL INDUSTRY CO., LTD.) and 0.60 g of ethyltriphenylphosphonium bromide (available from ACROSS) were added to 62.30 g of propylene glycol monomethyl ether and dissolved therein. After replacing the reaction vessel with nitrogen, the mixture was allowed to react at 135° C. for 4 hours to obtain a polymer solution. The polymer solution did not occur turbid, etc., even when it was cooled to room temperature and had a good solubility in propylene glycol monomethyl ether. GPC analysis showed that the obtained polymer in the solution had a weight average molecular weight of 2,591 in terms of standard polystyrene, and a dispersity of 1.41. The polymer obtained by this synthetic example had structural units represented by the following formula (1a) and formula (2a), and had the structure represented by the following formula (4a) at the terminal.

[Formula 24]

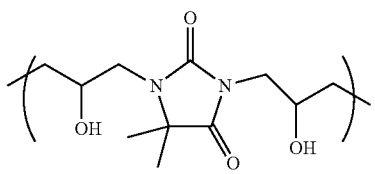
(1a)

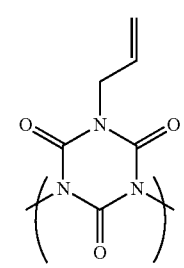
(2a)

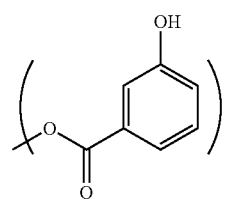
(4a)

Synthetic Example 2

7.50 g of diglycidyldimethylhydantoin (available from SHIKOKU CHEMICALS CORPORATION), 4.61 g of monoallyldiglycidyl isocyanuric acid (available from SHIKOKU CHEMICALS CORPORATION), 1.48 g of 3,4-dihydroxybenzoic acid (available from TOKYO CHEMICAL INDUSTRY CO., LTD.) and 0.60 g of ethyltriphenylphosphonium bromide (available from ACROSS) were added to 63.01 g of propylene glycol monomethyl ether, and dissolved therein. After replacing the reaction vessel with nitrogen, the mixture was allowed to react at 135° C. for 4 hours to obtain a polymer solution. The polymer solution did not occur turbid, etc., even when it was cooled to room temperature and had a good solubility in propylene glycol monomethyl ether. GPC analysis showed that the obtained polymer in the solution had a weight average molecular weight of 2,950 in terms of standard polystyrene, and a dispersity of 1.46. The polymer obtained by this synthetic example had structural units represented by the following formula (1a) and formula (2a), and had the structure represented by the following formula (3a) at the terminal.

[Formula 25]

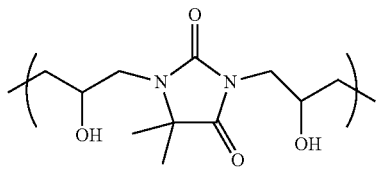

(1a)

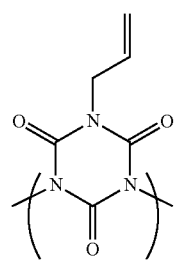

(2a)

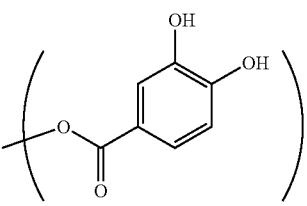

(3a)

Synthetic Example 3

5.40 g of diglycidyldimethylhydantoin (available from SHIKOKU CHEMICALS CORPORATION), 3.32 g of monoallyldiglycidyl isocyanuric acid (available from SHIKOKU CHEMICALS CORPORATION), 1.30 g of 1-Hydroxy-2-naphthoic acid (available from TOKYO CHEMICAL INDUSTRY CO., LTD.) and 0.43 g of ethyltriphenylphosphonium bromide (available from ACROSS) were added to 46.74 g of propylene glycol monomethyl ether, and dissolved therein. After replacing the reaction vessel with nitrogen, the mixture was allowed to react at 135° C. for 4 hours to obtain a polymer solution. The polymer solution did not occur turbid, etc., even when it was cooled to room temperature and had a good solubility in propylene glycol monomethyl ether. GPC analysis showed that the obtained polymer in the solution had a weight average molecular weight of 2,386 in terms of standard polystyrene, and a dispersity of 2.21. The polymer obtained by this synthetic example had structural units represented by the following formula (1a) and formula (2a), and had the structure represented by the following formula (5a) at the terminal.

[Formula 26]

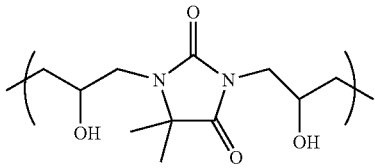

(1a)

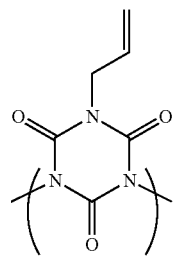

(2a)

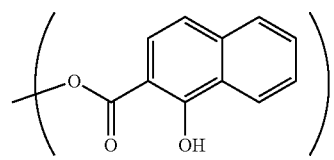

(5a)

Synthetic Example 4

9.00 g of diglycidyldimethylhydantoin (available from SHIKOKU CHEMICALS CORPORATION), 5.53 g of monoallyldiglycidyl isocyanuric acid (available from SHIKOKU CHEMICALS CORPORATION), 1.96 g of gallic acid (available from TOKYO CHEMICAL INDUSTRY CO., LTD.) and 0.71 g of ethyltriphenylphosphonium bromide (available from ACROSS) were added to 47.99 g of propylene glycol monomethyl ether, and dissolved therein. After replacing the reaction vessel with nitrogen, the mixture was allowed to react at 135° C. for 4 hours to obtain a polymer solution. The polymer solution did not occur turbid, etc., even when it was cooled to room temperature and had a good solubility in propylene glycol monomethyl ether. GPC analysis showed that the obtained polymer in the solution had a weight average molecular weight of 3,402 in terms of standard polystyrene, and a dispersity of 2.23. The polymer obtained by this synthetic example had structural units represented by the following formula (1a) and formula (2a), and had the structure represented by the following formula (6a) at the terminal.

[Formula 27]

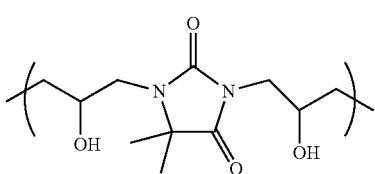

(1a)

Synthetic Example 5

9.00 g of diglycidyldimethylhydantoin (available from SHIKOKU CHEMICALS CORPORATION), 5.53 g of monoallyldiglycidyl isocyanuric acid (available from SHIKOKU CHEMICALS CORPORATION), 1.91 g of piperonyl alcohol (available from TOKYO CHEMICAL INDUSTRY CO., LTD.) and 0.71 g of ethyltriphenylphosphonium bromide (available from ACROSS) were added to 47.80 g of propylene glycol monomethyl ether, and dissolved therein. After replacing the reaction vessel with nitrogen, the mixture was allowed to react at 135° C. for 4 hours to obtain a polymer solution. The polymer solution did not occur turbid, etc., even when it was cooled to room temperature and had a good solubility in propylene glycol monomethyl ether. GPC analysis showed that the obtained polymer in the solution had a weight average molecular weight of 3,186 in terms of standard polystyrene, and a dispersity of 2.57. The polymer obtained by this synthetic example had structural units represented by the following formula (1a) and formula (2a), and had the structure represented by the following formula (7a) at the terminal.

[Formula 28]

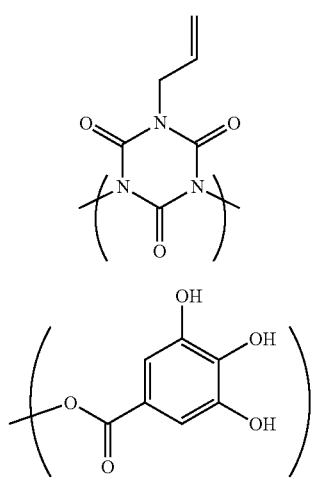

(1a)

(2a)

(6a)

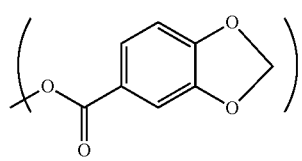

(7a)

Comparative Synthetic Example 1

9.00 g of diglycidyldimethylhydantoin (available from SHIKOKU CHEMICALS CORPORATION), 5.53 g of monoallyldiglycidyl isocyanuric acid (available from SHIKOKU CHEMICALS CORPORATION), 1.91 g of 4-(Methylsulfonyl)benzoic Acid (available from TOKYO CHEMICAL INDUSTRY CO., LTD.) and 0.71 g of ethyltriphenylphosphonium bromide (available from ACROSS) were added to 47.80 g of propylene glycol monomethyl ether, and dissolved therein. After replacing the reaction vessel with nitrogen, the mixture was allowed to react at 135° C. for 4 hours to obtain a polymer solution. The polymer solution did not occur turbid, etc., even when it was cooled to room temperature and had a good solubility in propylene glycol monomethyl ether. GPC analysis showed that the obtained polymer in the solution had a weight average molecular weight of 2,600 in terms of standard polystyrene, and a dispersity of 2.13. The polymer obtained by this synthetic example had structural units represented by the following formula (1a) and formula (2a), and had the structure represented by the following formula (8a) at the terminal.

[Formula 29]

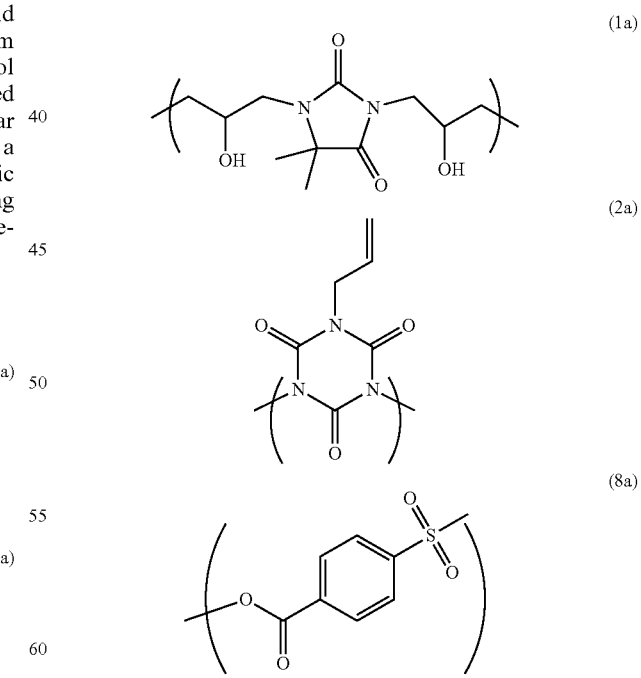

(1a)

(2a)

(8a)

Example 1

With 0.21 g of the polymer solution containing 0.031 g of the polymer obtained in the above-mentioned Synthetic Example 1 were mixed 0.0077 g of tetramethoxymethylglycoluril (available from Nihon Cytec Industries Inc.) and 0.0012 g of p-phenolsulfonic acid pyridinium salt (available from TOKYO CHEMICAL INDUSTRY CO., LTD.), and 47.81 g of propylene glycol monomethyl ether and 2.00 g of propylene glycol monomethyl ether acetate were added thereto to dissolve the materials. Thereafter, the mixture was filtered using a microfilter made of polyethylene having a pore size of 0.05 μm to make a resist underlayer film-forming composition for lithography.

Example 2

With 0.21 g of the polymer solution containing 0.031 g of the polymer obtained in the above-mentioned Synthetic Example 2 were mixed 0.0077 g of tetramethoxymethylglycoluril (available from Nihon Cytec Industries Inc., product name: POWDERLINK [registered trademark] 1174) and 0.0012 g of p-phenolsulfonic acid pyridinium salt (available from TOKYO CHEMICAL INDUSTRY CO., LTD.), and 47.81 g of propylene glycol monomethyl ether and 2.00 g of propylene glycol monomethyl ether acetate were added thereto to dissolve the materials. Thereafter, the mixture was filtered using a microfilter made of polyethylene having a pore size of 0.05 μm to make a resist underlayer film-forming composition for lithography.

Example 3

With 0.21 g of the polymer solution containing 0.031 g of the polymer obtained in the above-mentioned Synthetic Example 3 were mixed 0.0077 g of tetramethoxymethylglycoluril (available from Nihon Cytec Industries Inc.) and 0.0012 g of p-phenolsulfonic acid pyridinium salt (available from TOKYO CHEMICAL INDUSTRY CO., LTD.), and 47.81 g of propylene glycol monomethyl ether and 2.00 g of propylene glycol monomethyl ether acetate were added thereto to dissolve the materials. Thereafter, the mixture was filtered using a microfilter made of polyethylene having a pore size of 0.05 μm to make a resist underlayer film-forming composition for lithography.

Example 4

With 0.21 g of the polymer solution containing 0.031 g of the polymer obtained in the above-mentioned Synthetic Example 4 were mixed 0.0077 g of tetramethoxymethylglycoluril (available from Nihon Cytec Industries Inc.) and 0.0012 g of p-phenolsulfonic acid pyridinium salt (available from TOKYO CHEMICAL INDUSTRY CO., LTD.), and 47.81 g of propylene glycol monomethyl ether and 2.00 g of propylene glycol monomethyl ether acetate were added thereto to dissolve the materials. Thereafter, the mixture was filtered using a microfilter made of polyethylene having a pore size of 0.05 μm to make a resist underlayer film-forming composition for lithography.

Example 5

With 0.21 g of the polymer solution containing 0.031 g of the polymer obtained in the above-mentioned Synthetic Example 5 were mixed 0.0077 g of tetramethoxymethylglycoluril (available from Nihon Cytec Industries Inc.) and 0.0012 g of p-phenolsulfonic acid pyridinium salt (available from TOKYO CHEMICAL INDUSTRY CO., LTD.), and 47.81 g of propylene glycol monomethyl ether and 2.00 g of propylene glycol monomethyl ether acetate were added thereto to dissolve the materials. Thereafter, the mixture was filtered using a microfilter made of polyethylene having a pore size of 0.05 μm to make a resist underlayer film-forming composition for lithography.

Comparative Example 1

With 0.21 g of the polymer solution containing 0.031 g of the polymer obtained in the above-mentioned Comparative Synthetic Example 1 were mixed 0.0077 g of tetramethoxymethylglycoluril (available from Nihon Cytec Industries Inc.) and 0.0012 g of p-phenolsulfonic acid pyridinium salt (available from TOKYO CHEMICAL INDUSTRY CO., LTD.), and 47.81 g of propylene glycol monomethyl ether and 2.00 g of propylene glycol monomethyl ether acetate were added thereto to dissolve the materials. Thereafter, the mixture was filtered using a microfilter made of polyethylene having a pore size of 0.05 μm to make a resist underlayer film-forming composition for lithography.

[Dissolution Test into Photoresist Solvent]

The resist underlayer film-forming compositions of Example 1 to Example 5 and Comparative Example 1 were each applied onto a silicon wafer, which is a semiconductor substrate, by a spinner. The silicon wafers were placed on a hot plate and baked at 215° C. for 1 minute to form a resist underlayer film (film thickness 5 nm).

These resist underlayer films were immersed in each of ethyl lactate and propylene glycol monomethyl ether, which are solvents used for photoresist, and the films were confirmed to be insoluble in any of these solvents.

[Formation of Resist Pattern by KrF Exposure]

DUV-30J (antireflection film available from Nissan Chemical Industries, Ltd.) was applied as an antireflection film onto a silicon wafer substrate using a spinner. The silicon wafer was baked on a hot plate at 205° C. for 60 seconds to obtain a film having a film thickness of 18 nm. The resist underlayer film-forming compositions of Example 1 to Example 5 and Comparative Example 1 were each applied onto the film on the silicon wafer using a spinner. Each of the silicon wafers was baked on a hot plate at 215° C. for 60 seconds to obtain a resist underlayer film having a film thickness of 5 nm. A positive-type resist solution for KrF excimer laser was spin-coated on the resist underlayer film and heated at 110° C. for 60 seconds to form a KrF resist film. The resist film was exposed under predetermined conditions using an exposure device for KrF excimer laser (NSR S205C manufactured by Nikon Corporation). After the exposure, baking (PEB) was carried out at 110° C. for 60 seconds, the baked substrate was cooled to room temperature on a cooling plate, and after developing with butyl acetate, it was subjected to rinse treatment with butyl acetate to form a resist pattern with 170 nm line/340 nm pitch. For the measurement of the length of the resist pattern, a scanning electron microscope (CG4100 manufactured by Hitachi High-Technologies Corporation) was used. The exposure amount at which 170 nm line/340 nm pitch (line and space (L/S=1/1) was formed in the formation of the above-mentioned resist pattern was defined as the optimum exposure amount. Evaluation was carried out in view of the possibility of formation of 170 nm line and space (L/S), the size of the line width roughness (LWR) of the line pattern determined by the observation from the upper surface of the formed line pattern, and the minimum dimension immediately before collapse, which is the minimum line width at which no collapse of the resist pattern was observed. The results of the evaluation are shown in Table 1. When the line and space were formed, it was judged to be "good". Also, regarding LWR, the degree of fluctuation of the line width of the formed line pattern was expressed by nm. Since the smaller value of the LWR is preferable, Example 1 to Example 5 showed good LWR as compared with Comparative Example 1.

TABLE 1

|  | LWR | Formation of L/S is possible or not |
|---|---|---|
| Example 1 | 6.91 nm | Good |
| Example 2 | 6.93 nm | Good |
| Example 3 | 6.99 nm | Good |
| Example 4 | 5.88 nm | Good |
| Example 5 | 5.22 nm | Good |
| Comparative Example 1 | 7.36 nm | Good |

[EUV Exposure Test]

Onto a silicon wafer substrate, the resist underlayer film-forming compositions of Example 1 and Example 2 of the present invention and Comparative Example 1 were each spin-coated and heated at 215° C. for 1 minute to form a resist underlayer film. On each of the resist underlayer films, a resist solution for EUV was spin-coated and heated, and subjected to exposure under the condition of NA=0.33 Dipole using an EUV exposure apparatus (NXE3300B manufactured by ASML). After the exposure, PEB (post-exposure baking) was carried out, the baked substrate was cooled to room temperature on a cooling plate, and subjected to development and rinsing treatment to form a silicon wafer having a resist pattern thereon. Evaluation was carried out in view of the possibility of the formation of 16 nm line and space (L/S). Also, the exposure amount at which 16 nm line/32 nm pitch (line and space (L/S=1/1) was formed was defined as the optimum exposure amount, and the exposure amount (EOP) at that time was shown. Examples 1 and 2 showed an improvement in sensitivity as compared with Comparative Example 1.

TABLE 2

|  | EOP | Formation of L/S is possible or not |
|---|---|---|
| Example 1 | 31.0 mJ | Good |
| Example 2 | 31.0 mJ | Good |
| Comparative Example 1 | 32.5 mJ | Good |

INDUSTRIAL APPLICABILITY

The resist underlayer film-forming composition according to the present invention can provide a composition for forming a resist underlayer film capable of forming a desired resist pattern, and a resist pattern forming method using the resist underlayer film-forming composition.

The invention claimed is:

1. A resist underlayer film-forming composition, comprising an organic solvent and a polymer, wherein one or more terminal ends of the polymer are represented by the following formula (1) or (2):

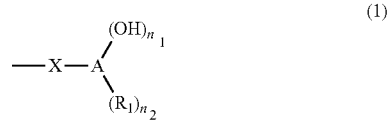

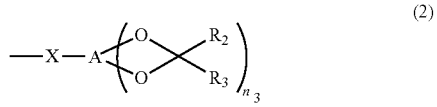

wherein, in formula (1) and formula (2),
X represents a divalent organic group;
A represents an aryl group having 6 to 40 carbon atoms;
$R_1$ represents a halogen atom, an alkyl group having 1 to 10 carbon atoms, an alkoxy group having 1 to 10 carbon atoms;
$R_2$ and $R_3$ each independently represent a hydrogen atom, a halogen atom, an alkyl group having 1 to 10 carbon atoms which may be substituted or an aryl group having 6 to 40 carbon atoms which may be substituted;
n1 represents an integer of 2 to 12;
n3 represents an integer of 1 to 12; and
n2 represents an integer of 0 to 11.

2. The resist underlayer film-forming composition according to claim 1, wherein X in formula (1) and formula (2) is an ester group or an ether group.

3. The resist underlayer film-forming composition according to claim 1, wherein A in formula (1) and formula (2) is a group selected from benzene, naphthalene or anthracene.

4. The resist underlayer film-forming composition according to claim 1, wherein $R_2$ and $R_3$ in formula (2) are hydrogen atoms.

5. The resist underlayer film-forming composition according to claim 1, wherein n2 in formula (1) is 0.

6. The resist underlayer film-forming composition according to claim 1, wherein a main chain of the polymer comprises a structural unit represented by the following formula (3):

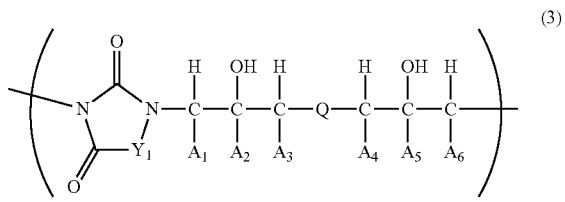

wherein, in formula (3),
$A_1, A_2, A_3, A_4, A_5$ and $A_6$ each independently represent a hydrogen atom, a methyl group or an ethyl group;
$Y_1$ represents formula (4), formula (5), formula (6) or formula (7):

-continued

(7)

wherein, in formula (4) to (7), $R_4$ and $R_5$ each independently represent a hydrogen atom, an alkyl group having 1 to 6 carbon atoms, an alkenyl group having 3 to 6 carbon atoms, a benzyl group or a phenyl group, and the phenyl group may be substituted with at least one group selected from the group consisting of an alkyl group having 1 to 6 carbon atoms, a halogen atom, an alkoxy group having 1 to 6 carbon atoms, a nitro group, a cyano group, a hydroxy group and an alkylthio group having 1 to 6 carbon atoms;

$R_4$ and $R_5$ may be bonded to each other to form a ring having 3 to 6 carbon atoms; $R_6$ represents an alkyl group having 1 to 6 carbon atoms, an alkenyl group having 3 to 6 carbon atoms, a benzyl group or a phenyl group, and the phenyl group may be substituted with at least one group selected from the group consisting of an alkyl group having 1 to 6 carbon atoms, a halogen atom, an alkoxy group having 1 to 6 carbon atoms, a nitro group, a cyano group, a hydroxy group and an alkylthio group having 1 to 6 carbon atoms; and Q represents formula (8) or formula (9):

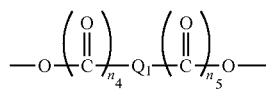
(8)

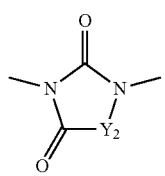
(9)

wherein, in formulae (8) and (9), $Q_1$ represents an alkylene group having 1 to 10 carbon atoms, a phenylene group, a naphthylene group or an anthrylene group, and the phenylene group, the naphthylene group and the anthrylene group each may be substituted with at least one group selected from the group consisting of an alkyl group having 1 to 6 carbon atoms, a halogen atom, an alkoxy group having 1 to 6 carbon atoms, a nitro group, a cyano group, a hydroxy group and an alkylthio group having 1 to 6 carbon atoms;

n4 and n5 each independently represent an integer of 0 or 1; and $Y_2$ represents formula (4), formula (5) or formula (7).

7. The resist underlayer film-forming composition according to claim 6, wherein the main chain of the polymer comprising the structural unit represented by formula (3) is formed from a reaction of a compound represented by formula (10) and a compound represented by formula (11) as comonomers:

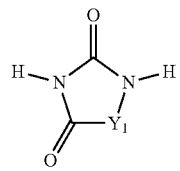
(10)

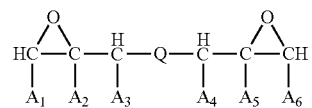
(11)

wherein, in formulae (10) and (11), $A_1, A_2, A_3, A_4, A_5, A_6$, $Y_1$ and Q have the same meaning as defined in claim 6.

8. The resist underlayer film-forming composition according to claim 6, wherein the main chain of the polymer comprising the structural unit represented by formula (3) is formed from a reaction of a compound represented by formula (12) and a compound represented by formula (13) as comonomers:

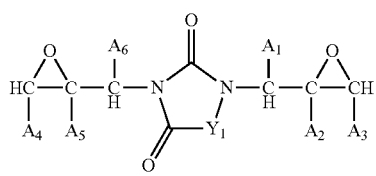
(12)

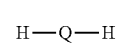
(13)

wherein, in the formula, $A_1, A_2, A_3, A_4, A_5, A_6, Y_1$ and Q have the same meaning as defined in claim 6.

9. The resist underlayer film-forming composition according to claim 1, further comprising a cross-linking acid catalyst.

10. The resist underlayer film-forming composition according to claim 1, further comprising a cross-linking agent.

11. A resist underlayer film, which is a baked product of a coating film comprising the resist underlayer film-forming composition according to claim 1.

12. A method for producing a patterned substrate, comprising the steps of:

applying the resist underlayer film-forming composition according to claim 1 onto a semiconductor substrate and baking the applied composition to form a resist underlayer film, applying a resist onto the resist underlayer film and baking the applied resist to form a resist film, subjecting the semiconductor substrate covered with the resist underlying film and the resist to exposure, and subjecting the exposed resist film to development to perform patterning.

13. A method for producing a semiconductor device, comprising the steps of:

forming a resist underlayer film comprising the resist underlayer film-forming composition according to claim 1 on a semiconductor substrate, forming a resist film on the resist underlayer film, irradiating the resist film with a light or an electron beam and subjecting the resultant resist film to development to form a resist pattern, etching the resist underlayer film through the formed resist pattern to form a patterned resist underlayer film, and processing the semiconductor substrate using the patterned resist underlying film.

14. A resist underlayer film-forming composition, comprising an organic solvent and a polymer, wherein a main chain of the polymer comprises a structural unit represented by the following formula (3):

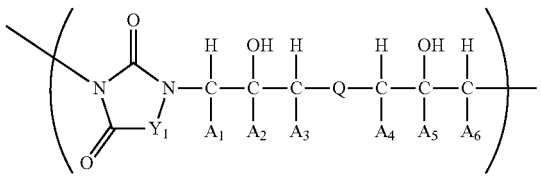

(3)

wherein in formula (3), $A_1$, $A_2$, $A_3$, $A_4$, $A_5$ and $A_6$ each independently represent a hydrogen atom, a methyl group or an ethyl group;

$Y_1$ represents formula (4), formula (5), formula (6) or formula (7):

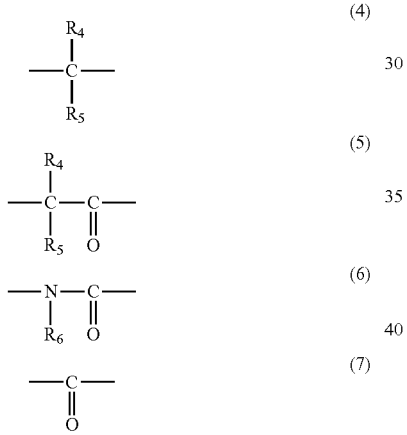

wherein, in formulas (4) to (7), $R_4$ and $R_5$ each independently represent a hydrogen atom, an alkyl group having 1 to 6 carbon atoms, an alkenyl group having 3 to 6 carbon atoms, a benzyl group or a phenyl group, and the phenyl group may be substituted with at least one group selected from the group consisting of an alkyl group having 1 to 6 carbon atoms, a halogen atom, an alkoxy group having 1 to 6 carbon atoms, a nitro group, a cyano group, a hydroxy group and an alkylthio group having 1 to 6 carbon atoms;

$R_4$ and $R_5$ may be bonded to each other to form a ring having 3 to 6 carbon atoms; $R_6$ represents an alkyl group having 1 to 6 carbon atoms, an alkenyl group having 3 to 6 carbon atoms, a benzyl group or a phenyl group, and the phenyl group may be substituted with at least one group selected from the group consisting of an alkyl group having 1 to 6 carbon atoms, a halogen atom, an alkoxy group having 1 to 6 carbon atoms, a nitro group, a cyano group, a hydroxy group and an alkylthio group having 1 to 6 carbon atoms; and Q represents formula (8) or formula (9):

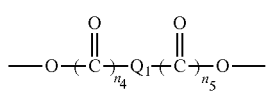

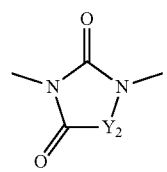

wherein, in formulae (8) and (9), $Q_1$ represents an alkylene group having 1 to 10 carbon atoms, a phenylene group, a naphthylene group or an anthrylene group, and the phenylene group, the naphthylene group and the anthrylene group each may be substituted with at least one group selected from the group consisting of an alkyl group having 1 to 6 carbon atoms, a halogen atom, an alkoxy group having 1 to 6 carbon atoms, a nitro group, a cyano group, a hydroxy group and an alkylthio group having 1 to 6 carbon atoms;

n4 and n5 each independently represent an integer of 0 or 1; and $Y_2$ represents formula (4), formula (5) or formula (7), and wherein one or more terminal ends of the polymer are represented by the following formula (1) or (2):

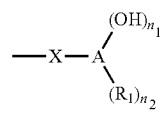

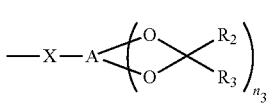

wherein, in formula (1) and formula (2),

X represents a divalent organic group;

A represents an aryl group having 6 to 40 carbon atoms;

$R_1$ represents a halogen atom, an alkyl group having 1 to 10 carbon atoms, an alkoxy group having 1 to 10 carbon atoms;

$R_2$ and $R_3$ each independently represent a hydrogen atom, a halogen atom, an alkyl group having 1 to 10 carbon atoms which may be substituted or an aryl group having 6 to 40 carbon atoms which may be substituted;

n1 and n3 each independently represent an integer of 1 to 12; and n2 represents an integer of 0 to 11.

15. The resist underlayer film-forming composition according to claim 14, wherein X in formula (1) and formula (2) is an ester group or an ether group.

16. The resist underlayer film-forming composition according to claim 14, wherein A in formula (1) and formula (2) is a group selected from benzene, naphthalene or anthracene.

17. The resist underlayer film-forming composition according to claim 14, wherein $R_2$ and $R_3$ in formula (2) are hydrogen atoms.

18. The resist underlayer film-forming composition according to claim 14, wherein n2 in formula (1) is 0.

19. The resist underlayer film-forming composition according to claim 14, wherein the main chain of the polymer comprising the structural unit represented by formula (3) is formed from a reaction of a compound represented by formula (10) and a compound represented by formula (11) as comonomers:

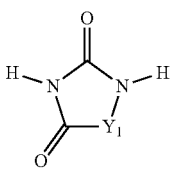

(10)

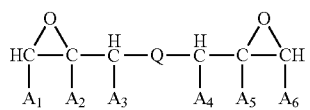

(11)

wherein, in formulae (10) and (11), $A_1, A_2, A_3, A_4, A_5, A_6$, $Y_1$ and Q have the same meaning as defined in claim 14.

20. The resist underlayer film-forming composition according to claim 14, wherein the main chain of the polymer comprising the structural unit represented by formula (3) is formed from a reaction of a compound represented by formula (12) and a compound represented by formula (13) as comonomers:

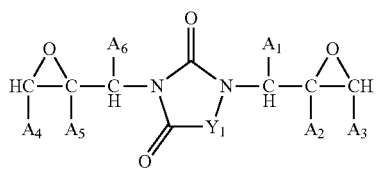

(12)

$$H-Q-H \quad (13)$$

wherein, in the formula, $A_1, A_2, A_3, A_4, A_5, A_6, Y_1$ and Q have the same meaning as defined in claim 14.

21. The resist underlayer film-forming composition according to claim 14, further comprising a cross-linking acid catalyst.

22. The resist underlayer film-forming composition according to claim 14, further comprising a cross-linking agent.

23. A resist underlayer film, which is a baked product of a coating film comprising the resist underlayer film-forming composition according to claim 14.

24. A method for producing a patterned substrate, comprising the steps of:
applying the resist underlayer film-forming composition according to claim 14 onto a semiconductor substrate and baking the applied composition to form a resist underlayer film,
applying a resist onto the resist underlayer film and baking the applied resist to form a resist film,
subjecting the semiconductor substrate covered with the resist underlying film and the resist to exposure, and
subjecting the exposed resist film to development to perform patterning.

25. A method for producing a semiconductor device, comprising the steps of:
forming a resist underlayer film comprising the resist underlayer film-forming composition according to claim 14 on a semiconductor substrate,
forming a resist film on the resist underlayer film,
irradiating the resist film with a light or an electron beam and subjecting the resultant resist film to development to form a resist pattern,
etching the resist underlayer film through the formed resist pattern to form a patterned resist underlayer film, and
processing the semiconductor substrate using the patterned resist underlying film.

* * * * *